United States Patent
Füglister et al.

[11] Patent Number: 5,939,876
[45] Date of Patent: Aug. 17, 1999

[54] MEASURING DEVICE FOR A METAL-ENCLOSED, GAS-INSULATED HIGH-VOLTAGE INSTALLATION

[75] Inventors: Marcel Füglister, Gansingen; Alfred Walter Jaussi, Zürich; Andrzej Kaczkowski, Würenlingen; Markus Meng, Freienwil, all of Switzerland

[73] Assignee: Asea Brown Boveri AG, Baden, Switzerland

[21] Appl. No.: 08/908,680

[22] Filed: Aug. 7, 1997

[30] Foreign Application Priority Data

Aug. 23, 1996 [DE] Germany .......................... 196 33 989

[51] Int. Cl.⁶ .................................................. G01R 33/00
[52] U.S. Cl. ...................... 324/117 R; 324/127; 361/604
[58] Field of Search ............................. 324/536, 96, 126, 324/158, 117 R, 127; 250/361; 315/58; 361/328, 604

[56] References Cited

U.S. PATENT DOCUMENTS

| | | | |
|---|---|---|---|
| 3,835,353 | 9/1974 | Hermstein | 317/244 |
| 3,939,412 | 2/1976 | Hermstein | 324/96 |
| 4,354,154 | 10/1982 | Schiemann | 324/126 |
| 5,224,118 | 6/1993 | Vance | 373/60 |
| 5,432,438 | 7/1995 | Baumgartner | 324/127 |
| 5,469,050 | 11/1995 | Lorenz | 324/126 |

FOREIGN PATENT DOCUMENTS

| | | |
|---|---|---|
| 0510311A2 | 10/1992 | European Pat. Off. . |
| 0603857A1 | 6/1994 | European Pat. Off. . |
| 2215928 | 10/1973 | Germany . |
| 2341073 | 2/1975 | Germany . |
| 2313401C2 | 4/1982 | Germany . |
| 3544508A1 | 6/1987 | Germany . |
| 4121653A1 | 10/1992 | Germany . |
| 4121654A1 | 1/1993 | Germany . |
| 4137865A1 | 5/1993 | Germany . |

OTHER PUBLICATIONS

"Die intelligente GIS–grundlegender Wandel in der Kombination von Primar–und Sekundartechnik", ABB Technik 8, 1996, pp. 4–14.

*Primary Examiner*—Josie Ballato
*Assistant Examiner*—Thomas Valone
*Attorney, Agent, or Firm*—Burns, Doane, Swecker & Mathis, L.L.P.

[57] ABSTRACT

The measuring device is intended for a metal-enclosed, gas-insulated high-voltage installation. It contains at least one sensor (10, 11), arranged in an enclosure tube (3) of the metal enclosure which is filled with insulating gas, and at least one electronic evaluation device (23, 23'), which processes output signals of the sensor (10, 11). The evaluation device (23, 23') and a plug-and-socket device (28, 28') connecting the evaluation device to an output of the sensor (10, 11) are arranged in a two-part metal housing. One part of this housing is formed by a hollow metal flange (26), integrally formed on the outer surface of the enclosure tube (3), and the region of the enclosure tube (3) rimmed by the hollow flange (26). The other part of the housing is a housing element (27) which is depressed in the shape of a trough and is fastened to the hollow metal flange (26) of the enclosure tube (3) by its edge, which delimits the trough opening. This measuring device is distinguished by a compact design and, because of the local control, by a high measuring accuracy and a high operational reliability.

24 Claims, 5 Drawing Sheets

MEASURING DEVICE FOR A METAL-ENCLOSED, GAS-INSULATED HIGH-VOLTAGE INSTALLATION

BACKGROUND OF THE INVENTION

1. Field of the Invention

The invention proceeds from a measuring device for a metal-enclosed, gas-insulated high-voltage installation. Such a measuring device contains at least one sensor arranged in an enclosure tube, filled with insulating gas, of the metal enclosure, and an electronic evaluation device processing output signals on the at least one sensor. The measuring device serves principally to measure a current conducted in an inner conductor of the high-voltage installation, and/or to measure the voltage of this inner conductor, but can also be used to measure other physical quantities of the installation, for example to measure the pressure, the temperature and/or the density of the insulating gas, or to measure partial discharges.

2. Discussion of Background

The invention refers in this connection to a prior art of measuring devices for metal-enclosed, gas-insulated high-voltage installations such as is disclosed, for example, in EP 0 510 311 A2. The combined current and voltage transformer for a metal-enclosed, gas-insulated high-voltage installation described in this prior art contains in the interior of an enclosure tube, filled with insulating gas, of the metal enclosure a Rogovski coil, which is led around a current-carrying conductor, and serves to measure the conductor current, as well as a tubular metal electrode, which is arranged concentrically with the conductor in an electrically isolated fashion and serves to measure the conductor voltage. Output signals emitted by the Rogovski coil and the measuring electrode are led in shielded lines through the wall of the enclosure tube to an evaluation electronics system, which is situated remote from the metal enclosure and in which there are formed from the output signals measured values which correspond to the current conducted in the conductor or to the voltage present across the conductor. However, it is not possible in this case reliably to exclude environmentally induced variations or disturbances in the output signals, for example as a consequence of the electromagnetic fields or of the effect of mechanical forces on the transmission lines.

SUMMARY OF THE INVENTION

Accordingly, one object of the invention is to provide a novel measuring device for a metal-enclosed, gas-insulated high-voltage installation having at least one sensor arranged in an enclosure tube of the metal enclosure, which measuring device is distinguished by a high measuring accuracy even in an environment exposed to strong electromagnetic fields and unexpected mechanical loads.

In the measuring device according to the invention, the electronic evaluation device, which is fed by the at least one sensor, is arranged in a two-part metal housing which ensures EMC protection. Since, in addition to a trough-shaped housing element, this housing also has a part of the outer surface of the enclosure tube with a hollow flange integrally formed thereon, vulnerable transmission paths for the output signals emitted by the at least one sensor are eliminated, and the measuring device thereby attains good accuracy. At the same time, the omission of transmission paths outside the metal housing, as well as the arrangement of the electronic evaluation device with EMC protection contribute to a substantially higher level of operational reliability of the high-voltage installation, since the measuring device relays measured values to a higher-order control and protection system independently of environmental influences, after having processed them and, if appropriate, formatted and serialized them. The measured values output by the measuring device can be used to carry out various tasks such as control, measurement, protection and power metering. The high number of sensors required for this to date can therefore be very substantially reduced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
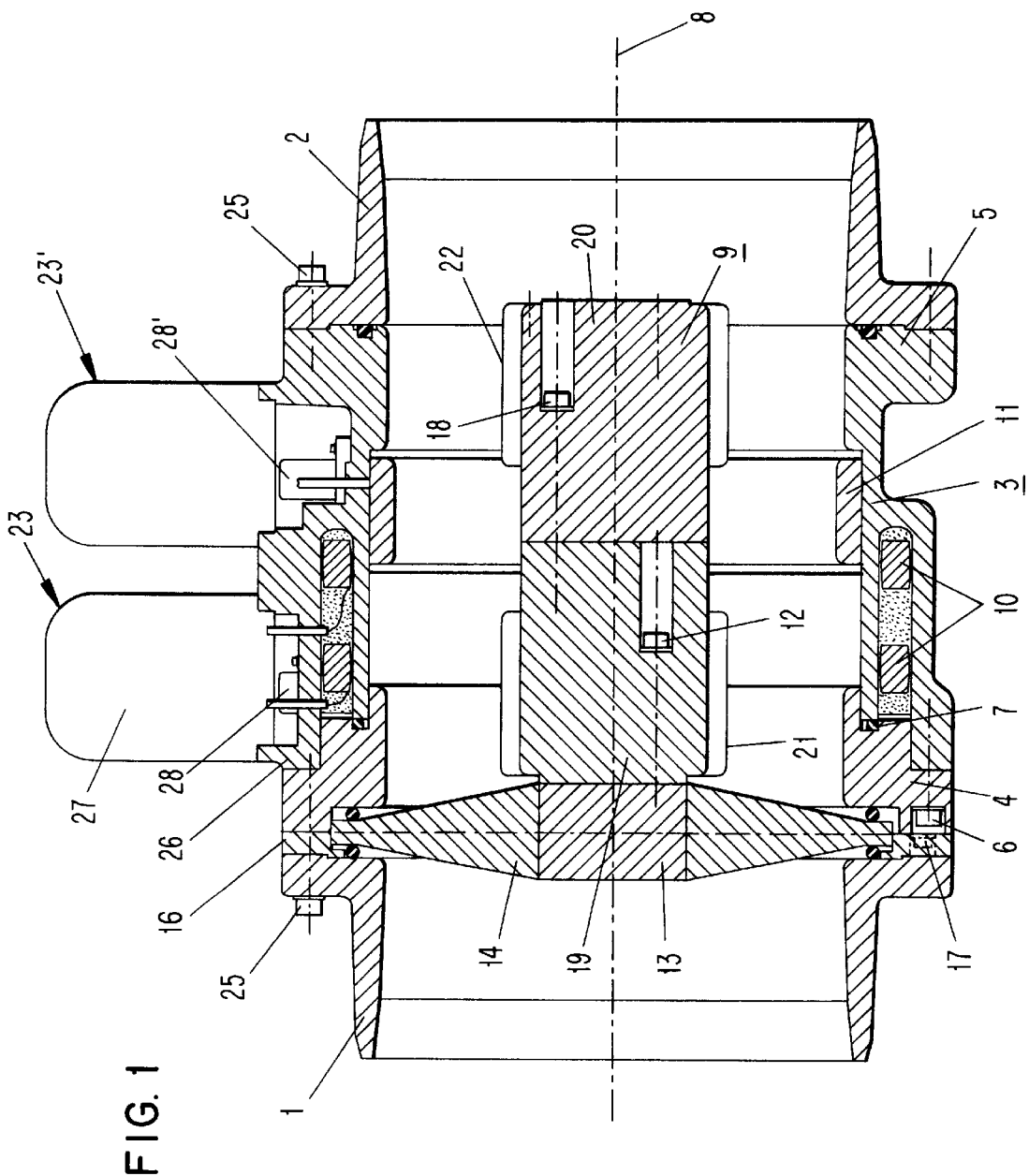
FIG. 1 shows, in a section in the axial direction, an embodiment of a measuring device according to the invention having an enclosure tube and a current-carrying conductor arranged in the tube interior, as well as having sensors which are arranged in the tube interior and are constructed as a Rogovski coil or insulated measuring electrode, and having a two-part metal housing containing an electronic evaluation device.

Referring now to the drawings, wherein like reference numerals designate identical or corresponding parts throughout the several views, the measuring device represented in FIG. 1 has an enclosure tube 3 clamped between two flanges 1, 2 of a metal enclosure which is filled with an insulating gas such as, in particular, $SF_6$ at a pressure of up to a few bars. The enclosure tube 3 is formed by two metal tube sections 4, 5, which each have a flange and are braced against one another in a gas-tight fashion by means of screws 6 and a sealing ring 7. Led on the axis 8 of the enclosure tube 3 is a conductor 9, which is essentially of cylindrical construction and at a high-voltage potential of typically several hundred kV. Located in a cavity delimited by the two tube sections 4, 5 are two Rogovski coils 10 which detect the current conducted in the conductor 9. A metal measuring electrode 11 which is arranged in an electrically isolated fashion with respect to the enclosure tube 3 and detects the high voltage across the conductor 9 is attached to the inner surface of the enclosure tube facing the conductor 9 in a circular groove delimited by the tube sections 4 and 5.

With the aid of screws 12, the conductor 9 is rigidly connected to a cast armature 13, arranged on the axis 8, of an insulator 14. The screws 12 are guided in the direction of the axis 8 and are protected against unauthorized operation by means of a seal (sealing wax) or a lead seal. An annular outer edge of the insulator 14 is fixed to the flange of the tube section 4 with the aid of an axially guided holding ring 16. Screws 17 which fix the holding ring 16 to the tube section 4 are likewise protected against unauthorized operation with the aid of a seal or a lead seal.

It can be seen that the conductor 9 is formed by two conductor sections 19, 20 which are rigidly connected to one another by axially guided screws 18. The result of this is that the screws 12 fixing the conductor 9 to the insulator 14 can be relatively short. Like the screws 12 and 17, the screws 18 are protected against unauthorized operation by a seal or by a lead seal. A similar statement also holds for further screws (not designated), which serve to fasten shields 21, 22 rigidly to the conductor 9.

A defined field geometry can be adhered to in the interior of the enclosure tube 3 owing to the rigid fastening of the conductor 9 to the insulator 14, rigidly connected to the enclosure tube 3, instead of the otherwise usual floating mounting of the conductor 9 on spring contacts, as well as to the defined holding of the screens. This is of decisive importance for the accuracy of a voltage-proportional signal output by the measuring electrode 11. The locking provided by the screws 12, 17, 18, as well as the shields 21, 22 ensures that after the part of the measuring device subjected to high voltage is produced the field geometry of the device is not changed. The sensors contained in the measuring device, such as the Rogovski coils 10, the measuring electrode 11 and further sensors which may be present, such as temperature sensors, pressure sensors and density sensors, partial discharge sensors and arc monitors, can now be calibrated, and the calibration values thereby determined, as well as further characteristics such as compensation curves, which detect temperature-induced measurement errors, for example, can be stored in a read-only data memory (for example a PROM) of an electronic evaluation device 23 of the measuring device which is arranged outside the interior, filled with insulating gas, of the enclosure tube 3. This data memory can likewise be protected against unauthorized operation by a lead seal or a seal, and is accessible only to the electronic system of the evaluation device 23. If the electronic system of the evaluation device 23 has defective components, after these have been replaced the electronic system newly inserted into the evaluation device can directly access the data stored in the PROM. Calibration work in replacing the electronic system can therefore be eliminated.

The measuring device in accordance with FIG. 1 can be installed in the metal enclosure by clamping the flange 1 and the tube section 4 as well as the flange 2 and the tube section 5 in a gas-tight fashion with the aid of clamping screws 25 (sealing rings visible in the figures but not designated).

The outputs of the Rogovski coils 10 and the measuring electrode 11 are led to the evaluation device 23 accommodated in a two-part metal housing via shielded measuring cables and housing bushings, of which the housing bushing for the measuring cable connected to the measuring electrode 11 is designed in a gas-tight fashion. A further evaluation device 23' can be provided in a further metal housing. The evaluation device 23 can be intended predominantly for processing the output signals of the Rogovski coils 10, and the evaluation device 23' can be intended predominantly for processing the output signals of the measuring electrode 11. The output signals of the Rogovski coils 10 can, however, also be led into the evaluation device 23' and, conversely, the output signals of the measuring electrode 11 can be led into the evaluation device 23. The evaluation device 23 can also take over the tasks of the evaluation device 23' and the evaluation device 23' can take over the tasks of the evaluation device 23. The two evaluation devices 23 and 23' can also cooperate synchronously. Such a measuring device has a particular high degree of redundancy, since in the event of failure of one of the two evaluation devices the evaluation device which is still operational can carry out the further processing of the sensor output signals.

One part of the metal housing is formed in each case from a hollow metal flange 26, integrally formed on the outer surface of the enclosure tube 3, and from the region of the enclosure tube 3 which rims the hollow flange. The other part is a housing element 27 which is depressed in the shape of a trough and is fastened with its edge delimiting the trough opening to the hollow metal flange 26 of the enclosure tube 3. The evaluation device 23 is accommodated in this metal housing in a fashion protected against electromagnetic and mechanical effects. Since long transmission paths between the sensors and the evaluation device 23, and disturbances resulting therefrom, are thus eliminated, the processing rate and the measuring accuracy can be substantially increased.

Figure 2:
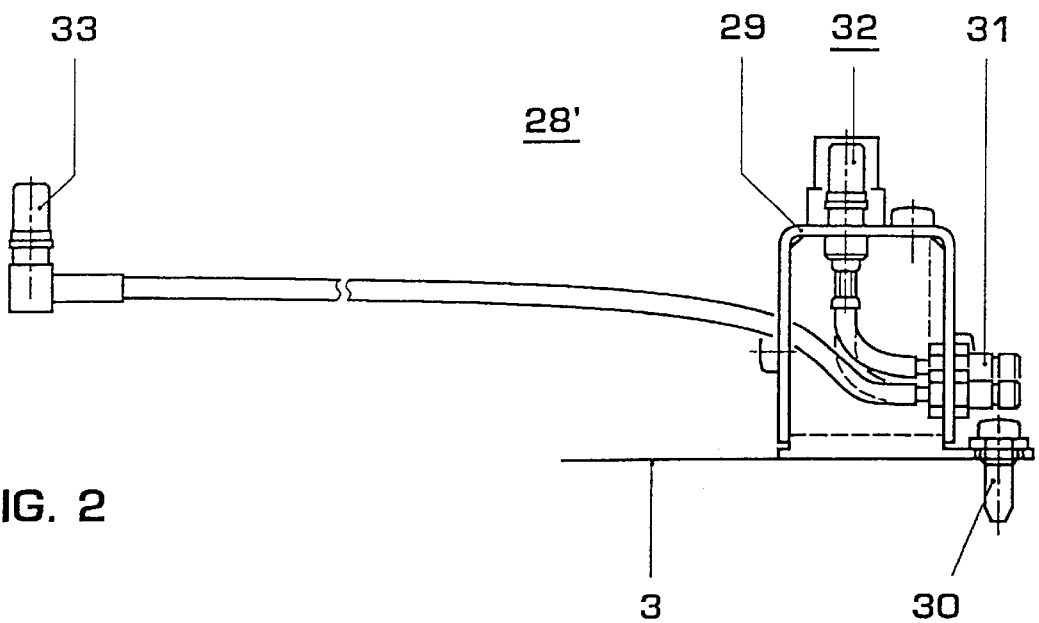
FIG. 2 shows a side view of a part, constructed as a socket connector, of a plug-and-socket device which is arranged in the metal housing and serves to connect the outputs of the sensors to the electronic evaluation device.

The shielded measuring cables leading the output signals of the sensors into the metal housing are led to a plug-and-socket device 28 or 28', respectively, arranged in the interior of the metal housing. The plug-and-socket device 28 or 28', respectively, has a plug-in part which is mounted in a floating fashion in a flat supporting surface, extending transverse to the plug-in direction, of the rimmed region of the enclosure tube 3. This plug-in part is represented in FIG. 2 for the plug-and-socket device 28'. It has an angularly constructed socket connector 29 containing a profile in the shape of a Z angle. A lower leg of the Z angle, which is led in the flat supporting surface, is mounted in a floating fashion by means of screws 30 held on the enclosure tube. A middle leg, attached in the shape of an L, of the Z bears a coupling piece 31 which can be connected in an electrically conducting fashion to a plug-in contact of the measuring cable. The other leg, attached to the middle leg, of the Z bears a coupling piece 32 which is connected to the coupling piece 31 and cooperates with a plug 45, to be seen in FIG. 3, of the evaluation device 23. A plug-in contact of the coupling piece 31 can be connected via a long piece of conductor to a plug-in contact 33 which cooperates in the neighboring metal housing with a coupling piece arranged on the socket connector of the plug-and-socket device 28.

Alternatively, the middle leg of the Z can be of relatively short construction. The coupling piece 31 can then be attached to the underside of the upper leg of the Z and be directly connected to the coupling piece 32.

Figure 3:
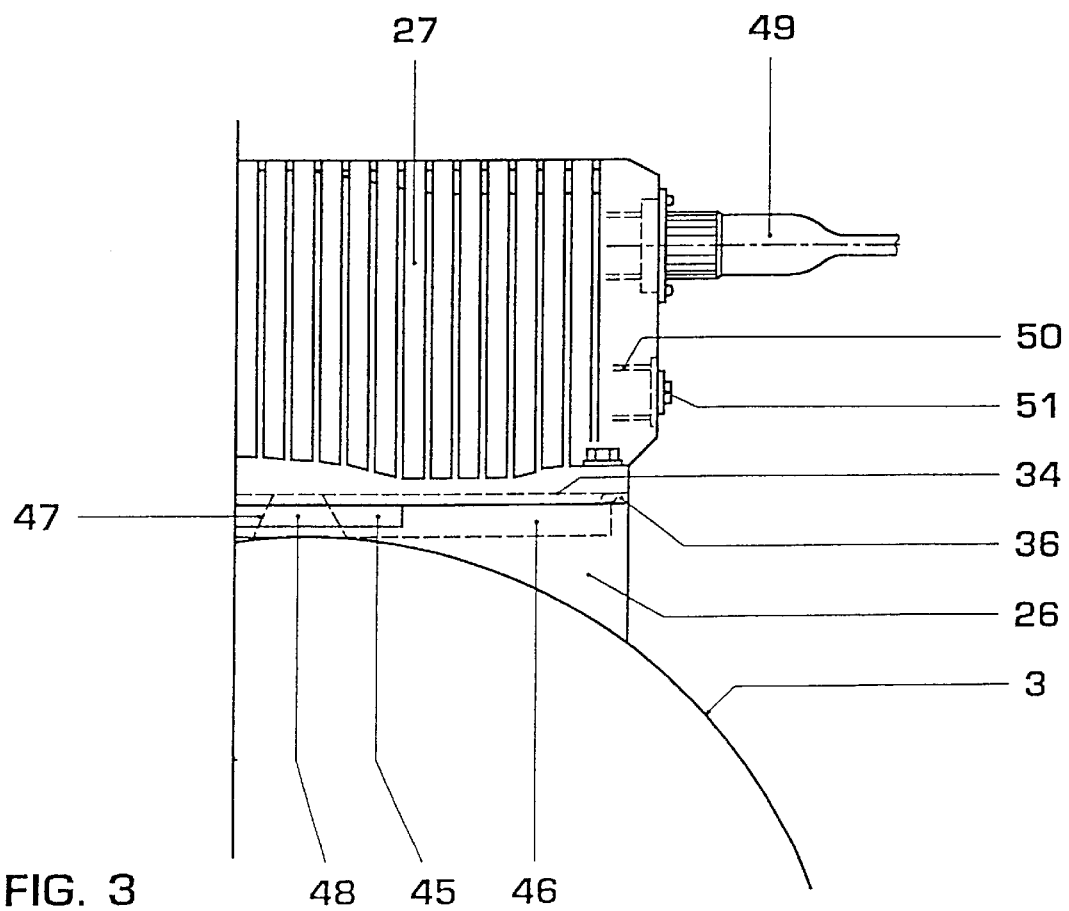
FIG. 3 shows a side view from the right of a part of the measuring device according to FIG. 1 which contains the metal housing.
Figure 4:
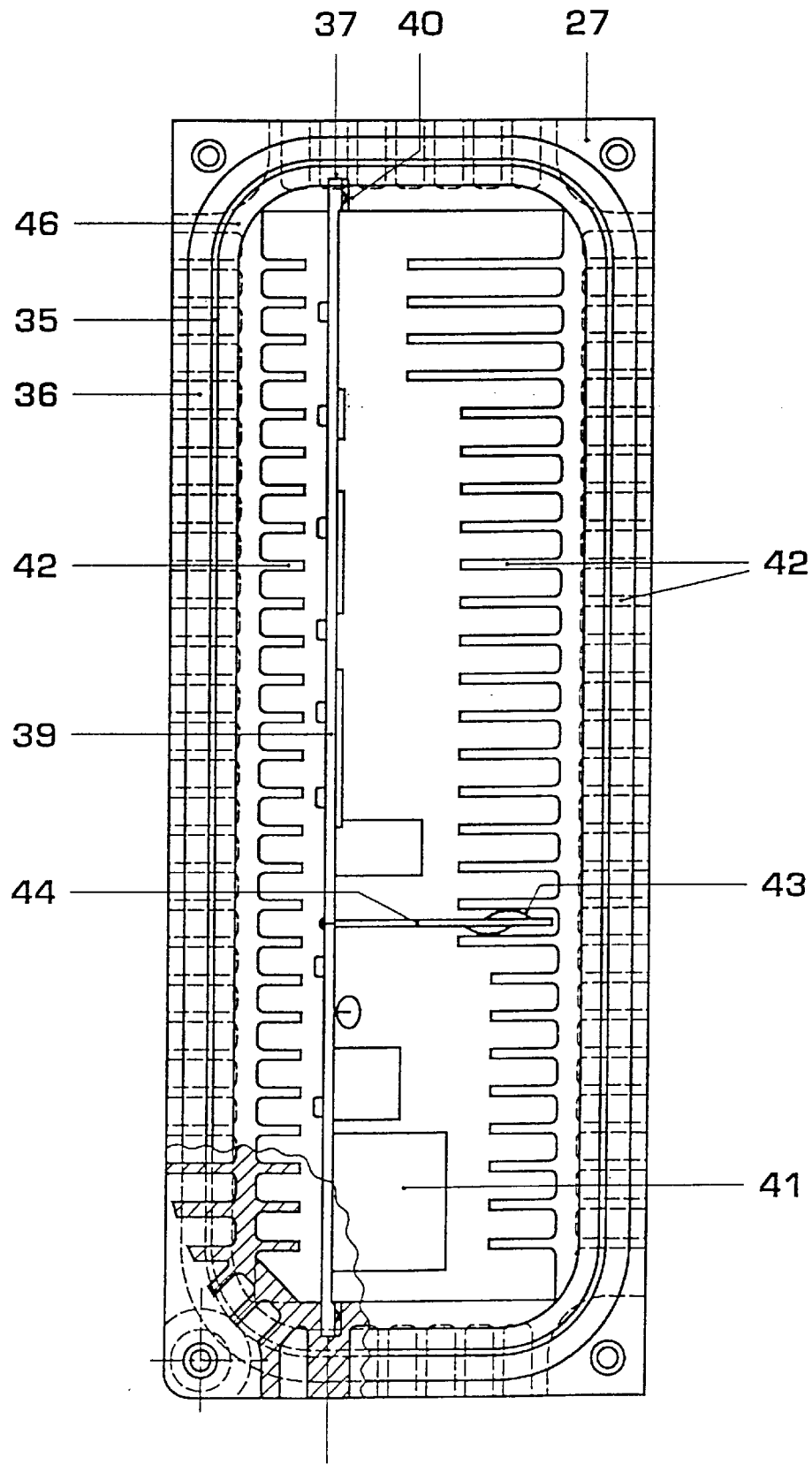
FIG. 4 shows a bottom view of a part, designed as a trough-shaped housing element, of the metal housing contained in the measuring device according to FIG. 1.

The design and the arrangement of the metal housing containing the evaluation device 23 or 23', respectively, are to be seen in FIGS. 3 and 4. The hollow flange 26 has a flat contact surface 34 which is led around the flange opening (FIG. 3) and cooperates with a flat contact surface 35, led around the trough opening, of the edge of the trough (FIG. 4), with the formation of an electrical connection. The two parts, essentially formed by the hollow flange 26 and the housing element 27, of the metal housing are thus connected to one another in an electrically conducting fashion and form a Faraday cage for the evaluation device. The two annularly closed contact surfaces are surrounded by at least one O-ring 36 clamped between the hollow flange 26 and the edge of the trough. This produces a virtually gas-tight connection of the two housing parts, and at the same time the two contact surfaces 34 and 35 are protected against pollutants arriving from outside.

At least one groove 37 or 38, respectively, extending from the edge of the trough in the direction of the trough bottom is formed in each case on mutually opposite inner surfaces of the housing element 27 (FIG. 4). This groove serves to hold an edge of a printed circuit board 39 of the evaluation device which can be connected in an electrically conducting fashion to one or more plug-in contacts of the plug-and-socket device 28 or 28', respectively. The groove 37 or 38, respectively, is designed to be oversized and holds contact springs 40 additionally attached to the edge of the printed circuit board 39. Conductor tracks, connected to the contact springs, of the printed circuit board 39 are led in this way to the potential of the metal housing. Electronic components located on the printed circuit board 39 and having a covering 41 connected electrically to the contact springs 40 are thus shielded electromagnetically.

Cooling ribs 42 are formed on the inside and/or outside in the trough-shaped housing element 27. The inner cooling ribs absorb heat produced by the electronic components. This heat is led to the outside and dissipated to the environment by the outer cooling ribs.

The inner cooling ribs can fulfill additional tasks. As may be seen from FIG. 4, an edge and contact springs 43 of an electromagnetic shield 44 of the evaluation device, which shield is constructed in the shape of a plate and arranged between two electronic components can be arranged between two adjacently arranged cooling ribs 42. This shield 44 acts as an electromagnetic barrier between the neighboring electronic components.

The trough opening is sealed with an electromagnetically shielding cover plate, as well as with the plug 45, which is led through an opening in the cover plate and bears plug-in contacts cooperating with the coupling piece 32. The housing element 27 has a collar 46, which projects beyond the edge of the trough and is led through the flange opening in the hollow flange 26. The collar 46 additionally projects beyond the plug 45 and has a material cutout 48 cooperating with a projection 47 of the hollow flange 26 (FIG. 3).

The collar 46 fulfills the following functions: when the measuring device is being assembled, it leads the housing element 27 into the hollow flange 26. In this case, the projection 47, which cooperates as a code with the material cutout 48, ensures that the housing element 27, and thus the plug 45, is inserted in the correct position into the coupling piece 32. It is excluded in this way that the output signal of one or of the Rogovski coils 10, for example, is led by a wrong plug-in connection to an electronic component of the evaluation device which is unsuitable for processing it. Since the collar 46 projects beyond the plug 45, during assembly the plug 45 cannot come into contact with a part of the hollow flange and thereby be damaged.

During assembly, it is advantageous that the socket connector 29 is mounted in a floating fashion. Unavoidable misalignments of the coupling piece 32 and the plug 45 can thus be compensated in a particularly simple way.

As may be seen from FIG. 3, attached to the housing element 27 is a plug 49 which cooperates with a coupling piece which is led through the wall of the housing element 27 and is connected to the evaluation device 23 or 23', respectively. By means of the plug-and-socket connection thus formed, the evaluation device 23 or 23', respectively, communicates, preferably via interference-free optical fibers, with a higher-order control and protection system, and the evaluation device 23 or 23', respectively, is simultaneously supplied with electrical energy via a wire connection. The communication chiefly comprises the transmission of digitized measured values, for example of current, voltage, temperature, pressure or density, to the control and protection system, but can also serve the purpose of transmitting information formed in the control and protection system to the evaluation unit 23 or 23', respectively.

Also led through the wall of the housing element 27 is a ventilation opening 50 into which a ventilation device 51 of bolt-shaped construction is screwed. As may be seen from FIG. 5, this ventilation device has a bushing 52, which is provided with an external thread and can be fixed in the ventilation opening 50 by being screwed in. The bushing 52 is open on the end face pointing outwards. The end face of the bushing 52 which faces the interior of the metal housing formed by the hollow flange 26 and housing element 27 is formed by a wall 53 which is attached to the hollow cylindrical bushing wall and has a centrally arranged opening. Arranged in the interior of the bushing 52 are a sealing ring 54, which is supported on the wall 53, a diaphragm 55, which rests on the sealing ring, and a cylindrical bolt 56. The bolt 56 has, on its lateral surface, an external thread which cooperates with an internal thread of the bushing 52, and on its end face which is situated outside the ventilation opening 50 it has a radially guided slot 57 for a screwdriver. By screwing in the bolt 56, the diaphragm 55 is pressed against the sealing ring 54 supported on the wall 53, and the diaphragm 55 is thereby mounted in a gas-tight fashion in the bushing 52.

The diaphragm 55 acts like an air-permeable, dust-separating water vapor valve, which acts as a function of direction for water and leads water vapor which is present in the housing interior or formed there to the outside, but does not lead water vapor from the outside into the housing interior. This avoids the formation of condensed water in the housing interior, and thus impairment of the operational capability of the evaluation device 23 or 23', respectively. At the same time, the diaphragm 55 prevents the ingress of dust into the housing interior. Connected upstream of this water vapor valve is a splashwater guard formed by the bolt 56. This splashwater guard contains a labyrinth of channels which prevents the ingress of splashwater to the diaphragm 55 and permits the egress of splashwater which has penetrated.

Figure 5:
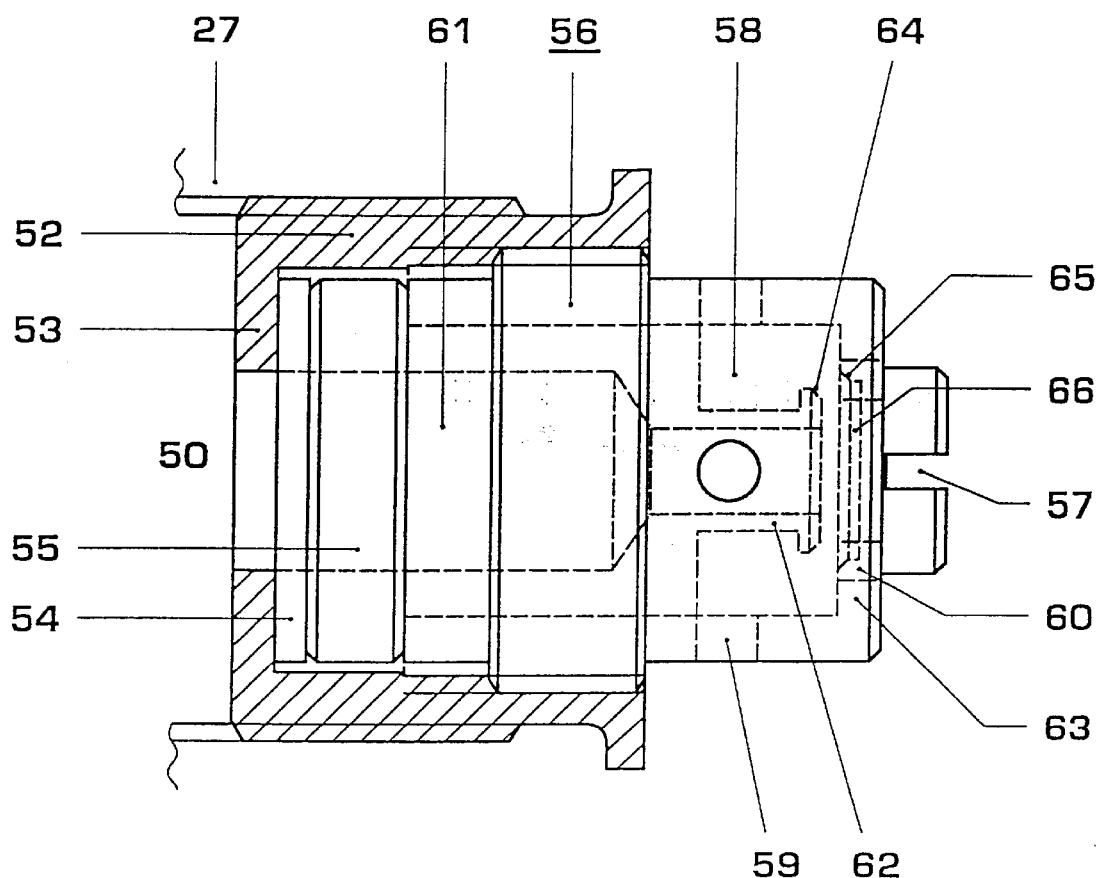
FIG. 5 shows a side view of a ventilation device arranged in a ventilation opening of the housing element in accordance with FIG. 4.
Figure 6:
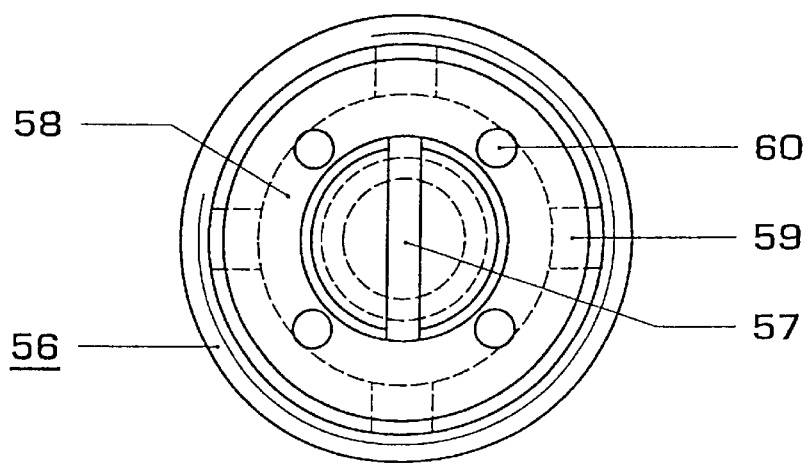
FIG. 6 shows a plan view of a splashwater guard of the ventilation device in accordance with FIG. 5.
Figure 7:
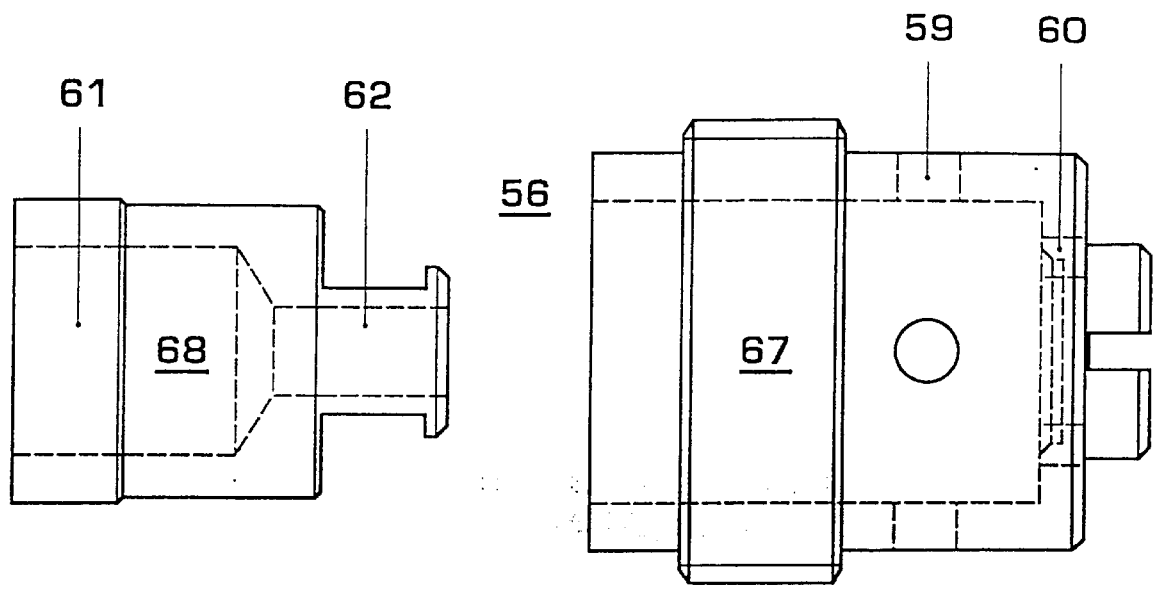
FIG. 7 shows an exploded representation of the splashwater guard in accordance with FIG. 6.

The labyrinth is represented by dashes in FIGS. 5 to 7. It has a prechamber 58 arranged in the bolt interior. This prechamber 58 is of annular construction and communicates with the outside via eight openings 59 and 60. From these eight openings, four openings 59 arranged offset by 90° relative to one another are led radially to the outside, and four openings 60 likewise arranged offset by 90° relative to one another are led axially to the outside. The labyrinth further has a main chamber 61 which extends in the axial direction in the bolt 56 and is led to the diaphragm 55. This main chamber 61 is connected to the prechamber 58 via at least one baffle.

A channel which is delimited by an axially aligned hollow pin 62 of mushroom-shaped construction and a wall 63 aligned essentially transverse to the pin 62 is provided for the purpose of connecting the main chamber 61 and the prechamber 58. The edge 64, facing the wall 63, of the mushroom cap, and an opposite edge 65 of a circular groove 66 let into the wall are designed to be beveled while forming an annular channel in the shape of a hollow conical frustum.

The four axially guided openings 60 provided in the wall 63 are arranged in such a way that splashwater which penetrates strikes only into the prechamber 58 or at most onto the beveled edge 64 of the mushroom cap. The radially guided openings 59 are arranged in the lateral surface of the bolt 56 in such a way that splashwater which penetrates can strike only the mushroom foot. Splashwater which penetrates therefore cannot reach the main chamber 61, and is removed from the prechamber 58 again in every position of the ventilation device 51 and thus also of the metal housing via at least one of the openings 59 and 60. It is thus possible to succeed with a high degree of reliability in avoiding the deposition of water on the diaphragm 55. Otherwise, deposited—possibly freezing—water could block the diaphragm 55. Water vapor formed in the housing interior could then no longer be led to the diaphragm 55, which acts like a valve, into the main chamber 61 and from there into the outside.

As may be seen from FIG. 7, the bolt 56 comprises a pot-shaped basic member 67 which contains the openings 59 and 60, and a bottle-shaped hollow member 68 containing the pin 62 and the main chamber 61. It is therefore possible in a particularly simple way to produce the bolt 56 containing the labyrinth by pressing the hollow member 68 into the basic member 67.

Figure 8:
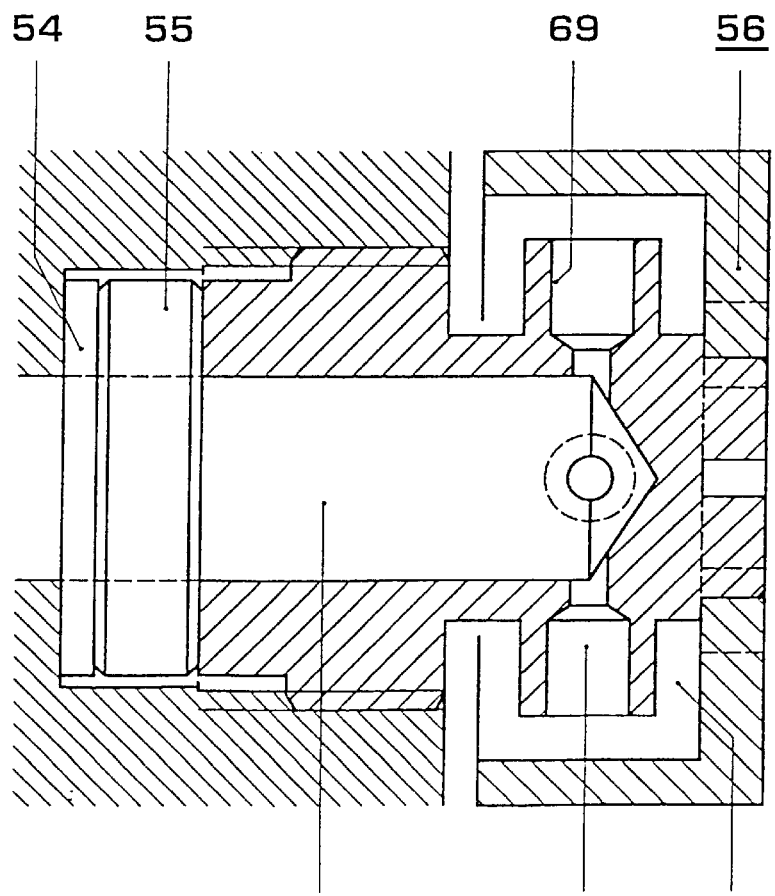
FIG. 8 shows a plan view of a section through a further embodiment of a ventilation device, whose splashwater guard has been modified by comparison with the splashwater guard of the ventilation device in accordance with FIG. 5.

An alternative embodiment of the bolt is to be seen in FIG. 8. In this embodiment, a plurality of radially guided channels 70, which are arranged distributed in the circumferential direction and open into the prechamber 58 by means of a projecting tube section 69 in each case, are provided for the purpose of connecting the main chamber 61 and the prechamber 58.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A measuring device for a metal-enclosed, gas-insulated high-voltage installation, comprising an enclosure tube filled with insulating gas;
    a two-part metal housing;
    at least one sensor, arranged in said enclosure tube, said at least one sensor including an output;
    at least one electronic evaluation device in communication with said at least one sensor output which processes output signals of said at least one sensor; and
    a plug-and-socket device connecting said evaluation device to said output of said at least one sensor, said at least one evaluation device and said plug-and-socket device arranged in said two-part metal housing, one part of said two-part metal housing formed by a hollow metal flange integrally formed on the outer surface of said enclosure tube and the region of said enclosure tube rimmed by said hollow flange, and a second part of said two-part metal housing including a housing element having an edge, said housing element being depressed in the shape of a trough and fastened to said hollow metal flange of said enclosure tube by said edge, said edge delimiting the trough opening.

2. The measuring device as claimed in claim 1, wherein said hollow flange has a flat contact surface which is led around the flange opening, said trough edge including a flat contact surface led around said trough opening, said flange flat contact surface and said trough flat contact surface forming an electrical connection.

3. The measuring device as claimed in claim 2, wherein said contact surfaces are surrounded by at least one O-ring clamped between said hollow flange and said edge of said trough.

4. The measuring device as claimed in claim 1, further comprising cooling ribs formed in said trough-shaped housing element.

5. The measuring device as claimed in claim 4, further comprising two electronic components and an electromagnetic shield in said evaluation device, said shield including an edge and contact springs, said shield constructed in the shape of a plate and arranged between said two electronic components, said edge and springs arranged in a guide provided in the interior of said housing element formed by two adjacently arranged cooling ribs.

6. The measuring device as claimed in claim 1, wherein said housing element includes at least one groove each formed on mutually opposite inner surfaces of said housing element and extending from the edge of the trough in the direction of the trough bottom for holding an edge of a printed circuit board of said evaluation device, said board electrically connected to a plug of said plug-and-socket device.

7. The measuring device as claimed in claim 6, wherein said groove is designed to be oversized for holding contact springs additionally attached to the edge of the printed circuit board.

8. The measuring device as claimed in claim 7, further comprising at least one electronic component located on the printed circuit board and electromagnetically shielded by a covering electrically connected to the contact springs.

9. The measuring device as claimed in claim 6, wherein said trough opening is sealed with an electromagnetically shielding cover plate and a plug led through an opening in said cover plate.

10. The measuring device as claimed in claim 9, wherein said housing element includes a collar which projects beyond the edge of the trough and is led through the opening of the hollow flange.

11. The measuring device as claimed in claim 10, wherein said collar includes a material cutout, and said hollow flange includes a projection, said cutout cooperating with said projection to prevent misalignment of said collar and said flange.

12. The measuring device as claimed in claim 10, wherein said collar projects beyond said plug.

13. The measuring device as claimed in claim 6, wherein said plug-and-socket device further comprises a coupling piece in contact with said plug and arranged on a socket connector of profiled construction mounted in a floating fashion on a flat supporting surface of the rimmed region of said enclosure tube, said flat supporting surface extending transverse to a plug-in direction of said plug-and-socket device.

14. The measuring device as claimed in claim 13, wherein a profile of said socket connector contains a Z angle whose lower leg is mounted in a floating fashion by means of a screw held on said enclosure tube, and whose upper leg bears said first coupling piece.

15. The measuring device as claimed in claim 1, wherein said metal housing includes at least one ventilation opening which is led through a wall of said trough-shaped housing element.

16. The measuring device as claimed in claim 15, further comprising a ventilation device arranged in said ventilation opening and having a directionally acting water vapor valve which is pervious to air, and a splashwater guard upstream of said water vapor valve.

17. The measuring device as claimed in claim 16, wherein said water vapor valve includes at least one diaphragm which leads water vapor to the outside of said housing from the housing interior but does not lead water vapor from the outside into the housing interior, and wherein said splashwater guard includes a labyrinth of channels which prevents the ingress of splashwater to said diaphragm and permits the egress of splashwater which has penetrated into said water vapor valve.

18. The measuring device as claimed in claim 17, further comprising a cylindrical bolt, and wherein said labyrinth is arranged in said cylindrical bolt which fixes said diaphragm in a gas-tight fashion.

19. The measuring device as claimed in claim 18, wherein said bolt comprises an axially extending main chamber, at least one baffle, and an annular prechamber, said prechamber being led to the outside of said bolt via a plurality of wall openings, said main chamber extending to said diaphragm and is connected to said prechamber via said at least one baffle.

20. The measuring device as claimed in claim 19, further comprising a plurality of radially guided channels, each including a projecting tube section, which are arranged distributed in the circumferential direction and open into said prechamber by said projecting tube sections, said radially guided channels, for connecting said main chamber and said prechamber.

21. The measuring device as claimed in claim 19, further comprising an axially aligned hollow pin of mushroom-shaped construction and a wall aligned essentially transverse to said pin, said pin and said transverse wall delimiting a channel for connecting said main chamber and said prechamber.

22. The measuring device as claimed in claim 21, wherein a mushroom-cup portion of said pin includes an edge facing said transverse wall, and further comprising a circular groove including an opposite edge, said circular groove let into said transverse wall, said circular groove and side edge being beveled to form an annular channel therebetween in the shape of a hollow conical frustum.

23. The measuring device as claimed in claim 22, wherein a first set of said openings which lead said prechamber to the outside is arranged in said transverse wall to prevent splashwater from penetrating into said bolt and past said beveled edge of said mushroom cap.

24. The measuring device as claimed in claim 1, wherein said at least one evaluation device comprises two redundant evaluation devices in communication with said at least one sensor output.

* * * * *